United States Patent [19]

Ogihara et al.

[11] Patent Number: 4,970,577
[45] Date of Patent: Nov. 13, 1990

[54] SEMICONDUCTOR CHIP MODULE

[75] Inventors: Satoru Ogihara; Shunichi Numata; Kunio Miyazaki; Takashi Yokoyama, all of Hitachi; Ken Takahashi, Ibaraki; Tasao Soga, Hitachi; Kazuji Yamada, Hitachi; Hiroichi Shinohara, Hitachi; Hideo Suzuki, Katsuta, all of Japan

[73] Assignee: Hitachi, Ltd., Tokyo, Japan

[21] Appl. No.: 337,145

[22] Filed: Apr. 12, 1989

[30] Foreign Application Priority Data

Apr. 12, 1988 [JP] Japan ................................ 63-88190

[51] Int. Cl.⁵ .................. H01L 23/12; H01L 23/04
[52] U.S. Cl. ..................................... 357/74; 357/80; 357/75
[58] Field of Search .................. 357/80, 68, 74, 75, 357/81; 361/412, 413, 414, 415, 420

[56] References Cited

U.S. PATENT DOCUMENTS

| 4,231,154 | 11/1980 | Gazdik et al. | 357/75 |
| 4,654,694 | 3/1987 | Val | 357/74 |
| 4,663,649 | 5/1987 | Suzuki et al. | 357/74 |
| 4,724,472 | 2/1988 | Sugimoto et al. | 357/74 |
| 4,783,722 | 11/1988 | Osaki et al. | 361/412 |

FOREIGN PATENT DOCUMENTS 0027667 2/1986 Japan ................................ 357/75
62-274648 11/1987 Japan ................................ 357/75

Primary Examiner—Rolf Hille
Assistant Examiner—S. V. Clark
Attorney, Agent, or Firm—Antonelli, Terry, Stout & Kraus

[57] ABSTRACT

A semiconductor chip module includes semiconductor chips each of which has contacts on its entire front face. A multi-layered organic circuit board having a small dielectric constant is provided for mounting the semiconductor chips. Intermediate ceramic substrates having the same thermal expansion coefficient as that of the semiconductor chip, are also provided. Each such intermediate ceramic substrate has contacts on its front and back faces corresponding to those of the semiconductor chip. These contacts are electrically connected directly in a one-to-one relationship. The contacts on the semiconductor chip and the corresponding ones on the front face of the intermediate ceramic substrates are connected by solder. The contacts on the back face of the intermediate ceramic substrate and the corresponding contacts on the front face of the multi-layered ceramic circuit board are connected by respective conductive pins having a predetermined flexibility and rigidity through a predetermined gap therebetween. With this arrangement, the relative displacement due to a thermal expansion difference between the intermediate ceramic substrate and the multi-layered organic circuit board is permitted without causing substantial stress thereon.

16 Claims, 2 Drawing Sheets

SEMICONDUCTOR CHIP MODULE

The present invention relates to a semiconductor chip module suitable for a reduced size large capacity computer with a high operating speed.

BACKGROUND OF THE INVENTION

The increasing demand of such reduced size large capacity computer with a high operating speed necessitates use of a semiconductor chip with a high integration density, such as a semiconductor chip of 10 mm square having more than 500 contacts, terminals or pins on its entire front face and more than 10W/chip heat radiation during operation and use of a multi-layered organic circuit board having a small or low dielectric constant for mounting such semiconductor chips with a high density.

The conventional semiconductor chip package having a good thermal conductivity such as a flat package and a pin grid array package are limited of their terminal number below 500, because they are taken out from the four sides of the semiconductor chip and further the substrate supporting the terminals becomes necessarily larger than the semiconductor chip, a high density mounting of such semiconductor chip packages on a multi-layered circuit board is rendered impossible.

The dielectric constant of a multi-layered organic circuit board is small in comparison with that of a ceramic insulating material. Even silica ($SiO_2$), which has a comparatively small dielectric constant among ceramic insulating material, has a dielectric constant of about 4. In contrast, the dielectric constant of a fluorine resin can be as small as 2.5. The dielectric constant of multi-layered organic circuit board which is mass produced at present is as small as 4.5. It is therefore possible to reduce the delay in signal propagation by using such multi-layered organic circuit board. Moreover it is possible to produce a large-sized multi-layered circuit board with a high precision by an organic material. It is therefore possible to mount a large number of semiconductor chips on such multi-layered organic circuit board.

However, the thermal expansion coefficient of such multi-layered organic circuit board is as large as 150 to $250\times10^{-7}$/°C. On the other hand, those of silicon semiconductor chip and of gallium arsenide semiconductor chip are respectively $35\times10^{-7}$/°C. and $60\times10^{-7}$/°C. Moreover the increase of the contact number more than 500 on the front face of the semiconductor chip makes the spacing between the adjacent contacts small such that the soldering area on the respective contacts for electrical connection is also rendered small. It is therefore impracticable to mount the semiconductor chips directly on the multi-layered organic circuit board by soldering, because the solder joints connecting the corresponding contacts breaks due to the large thermal expansion coefficient difference and the small soldering area.

A multi-layered circuit board and a ceramic substrate carrying semiconductor chips thereon and having a different thermal expansion coefficient from that of the circuit board were conventionally bonded by a so-called connector comprising a pair of engage-and disengageable contacts. However, in the case of using the connector, the spacing or pitch between adjacent contacts or terminals is limited to 1 mm, and the connection at a pitch of 0.5 mm or below was impossible.

Japanese Patent Application Laid-Open No. 60-257156 discloses a semiconductor chip module including a plurality of semiconductor chips, each having contacts on its entire front face, a first ceramic circuit board mounting the semiconductor chips thereon though a connecting solder and a second circuit board carrying an auxiliary circuit and connected with the first ceramic circuit board through the so-called engage-and disengageable connectors. Since the disclosed semiconductor chip module uses the ceramic circuit board, which has a comparatively high dielectric constant, the delay in signal propagation in the semiconductor chip mounting member of the semiconductor chip module is considered substantial.

SUMMARY OF THE INVENTION

One object of the present invention is to provide a semiconductor chip module having a high integration density.

Another object of the present invention is to provide a semiconductor chip module having a high signal propagation speed during operation.

Further object of the present invention is to provide a semiconductor chip module which mounts a plurality of semiconductor chips such as LSIs having contacts on their substantially entire front faces and spacing between adjacent contacts of below 0.5 mm with a high density.

A feature of the present invention is an introduction, between respective semiconductor chips and a multi-layered organic circuit board having a small dielectric constant, of an intermediate insulating substrates having substantially the same thermal expansion coefficient as that of semiconductor chips and a connecting member connecting the intermediate insulating substrates, each carrying the semiconductor chip, to the multi-layered organic circuit board in such a manner to permit relative displacement due to the thermal expansion coefficient difference between the intermediate insulating substrate and the multi-layered organic circuit board without causing substantial stress thereon. Contacts or terminals in array on the front and back faces of the respective intermediate insulating substrate, which corresponds to the contacts in array of the semiconductor chip, are electrically connected directly without any interconnection therebetween, in other words, the contacts on the front face and the back face are connected so as to correspond one to one. The connecting member mechanically couples through a predetermined gap of 0.5 to 1.0 mm the intermediate insulating substrate with the multi-layered organic circuit board in loosely restricted manner so that such stress is substantially eliminated that would be induced on a connecting member when the connecting member mechanically couples rigidly the intermediate insulating substrate and the multi-layered organic circuit board.

The connecting member is composed of electrical conductors with a predetermined flexibility and rigidity, such as in the shape of pin, strip, spiral or corrugate, mechanically coupling the intermediate insulating substrate and the multi-layered organic circuit board with the predetermined gap and electrically connecting the contacts on the back face of the intermediate insulating substrate and the corresponding ones on the front face of the multi-layered organic circuit board.

The intermediate insulating substrate may be composed of a first intermediate insulating substrate which carries the semiconductor chip, and a second intermediate insulating substrate which carries and fixes the electrical conductors of the connecting member. The connection of the first and second intermediate insulating substrates is effected by soldering the contacts on the back face of the first intermediate insulating substrate with the corresponding ones on the front face of the second intermediate insulating substrate such that disassembling of the semiconductor chip is facilitated only by separating the first intermediate insulating substrate from the second intermediate insulating substrate.

The intermediate insulating substrate may include a built-in capacitor which is connectable to a power source for driving the respective semiconductor chips to suppress the supply voltage fluctuation and reduce the noise in electrical signals. The built-in capacitor is formed within the intermediate insulating substrate by inserting a material having a high dielectric constant in place of one or more layers of the intermediate insulating substrate. As such a material, a perovskite material such as $PbO$, $Fe_2O_3$, $WO_3$, $TiO_2$ and $Nb_2O_5$ is used. These material has a dielectric constant as high as 3,000 to 20,000.

The intermediate insulating substrate is preferably a ceramic substrate having a thermal expansion coefficient of 30 to $65 \times 10^{-7}/°C.$, which is approximate to that of the semiconductor chip. This is because the respective semiconductor chips are directly bonded with the respective ceramic substrates by soldering the terminals on the semiconductor chips and the terminals on the ceramic substrates.

The intermediate insulating substrate is preferably formed of a ceramic material having a low dielectric constant in order to reduce the delay in the propagation of an electric signal therethrough. As a ceramic material having a low dielectric constant, a composite material of an inorganic filler such as silica and alumina and glass is used. Especially, a composite material of silica ($SiO_2$) and borosilicate glass and a composite material of silica and aluminum borate crystallized glass ($MgO.Al_2O_3.B_2O_3$) are preferable.

As a conductive material of the intermediate insulating substrate connecting the contacts on its front and back faces, an electric conductor having a high electric conductivity such as copper, silver, gold and an alloy thereof are used for enabling fine wiring and reducing loss due to voltage drop therethrough.

When the spacing between the adjacent contacts on the back face of the intermediate insulating substrate is required to be extended with respect to that between the adjacent contacts on the front face thereof, intermediate conductive layers with predetermined patterns have to be inserted in the intermediate insulating substrate to expand the spacing.

A intermediate ceramic insulating substrate with no built-in capacitor according to the present invention is produced, for example, in the following manner;

As the raw material, (1) 50 wt % of silica powder and 50 wt % of borosilicate glass or (2) 40 wt % of alumina powder and 60 wt % of borosilicate glass are mainly used.

The raw material is formed into a green sheet by a conventional doctor blade method. The thickness of the green sheet is about 0.2 mm. Through holes of 0.15 mm in diameter are formed in the green sheet by punching. A paste which becomes a conductor when baked, e,g., gold, silver, silver-palladium alloy and copper is embedded in the through holes by a printing method. A plurality of green sheets, for example 6, with the paste embedded in the through holes are laminated in such a manner that the conductor portions are connected to each other, and pressurized to make a laminate. If the conductor paste is gold, silver or a silver-palladium alloy, the laminate is baked at 850° to 950° C. in air to produce an intermediate ceramic insulating substrate for mounting a semiconductor chip thereon. If the conductor paste is copper, a non-oxidizing atmosphere such as nitrogen and argon atmospheres is adopted. The contacts on the front face of the intermediate ceramic insulating substrate produced are electrically connected to the contacts on the back face thereof by one to one relationship.

An intermediate ceramic insulating substrate provided with a built-in capacitor is produced in substantially the same way. Green sheets for the ceramic portion and for the capacitor portion are produced, and upper and lower electrodes are printed on the capacitor portion. After both of the portions including the electrodes are united into one, the composite is baked.

In the embodiments of the present invention, the multi-layered organic circuit board and the intermediate ceramic insulating substrate is connected by pins attached to the back face of the intermediate ceramic insulating substrate. The pin has flexibility and serves to permit displacement between the intermediate ceramic insulating substrate and the multi-layered organic circuit board due to a difference in the thermal expansion. The preferable material of the pin is copper due to the flexibility and excellent electric conductivity. A copper alloy, iron and nickel alloys are also usable. The preferable diameter of the pin is about 0.1 to 0.2 mm. The pins are also connected to the contacts of the intermediate ceramic insulating substrate by soldering material such as gold-germanium, gold-tin and lead-tin alloys. The pins are also connected to the respective metallized through holes or via holes formed on the face of the multi-layered organic circuit board by soldering.

The multi-layered organic circuit board is composed of an insulating material having a dielectric constant of not more than 4.5 such as epoxy, isomelamine and fluorine resins like a conventional one.

A ceramic material having a high thermal conductivity is directly bonded to the back face of the semiconductor chip. This ceramic material serves to radiate the heat which is produced from the semiconductor chip during operation. For this purpose, the ceramic material is required to have a high thermal conductivity. In order not to interfere with the thermal conductivity, the ceramic material is bonded by a solder such as gold-germanium alloy. In terms of the reliability of the joints, a ceramic material having a thermal expansion coefficient of 30 to $65 \times 10^{-7}/°C.$, which is approximate to that of the semiconductor chip used. The ceramic material preferably has a thermal conductivity of not less than 100 W/m.K. Examples of a ceramic material which satisfies those conditions are silicon carbide ceramic (thermal expansion coefficient: $37 \times 10^{-7}/°C.$, thermal conductivity: 140 to 280 W/m.K) and aluminum nitride ceramic (thermal expansion coefficient: $45 \times 10^{-7}/°C.$, thermal conductivity: 140 to 260 W/m.K).

DESCRIPTION OF THE PREFERRED EMBODIMENTS

The present invention will be explained in more detail with reference to the following embodiments, but the present invention is not restricted to these embodiments.

Figure 1:
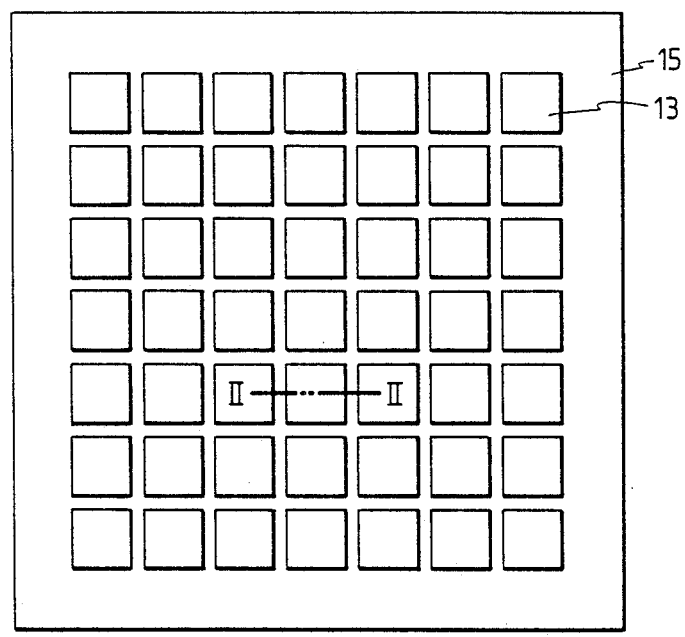
FIG. 1 is a plane view of one embodiment of a semiconductor chip module according to the present invention.
Figure 2:
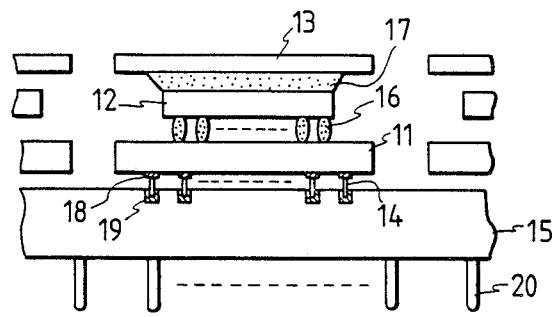
FIG. 2 is a schematic sectional view of the one embodiment shown in FIG. 1 taken along the line II13 II in FIG. 1.

One embodiment of the present invention will be explained with reference to FIGS. 1 and 2. In FIGS. 1 and 2, the reference numeral 11 represents an intermediate ceramic insulating substrate, 12 a semiconductor chip such as LSI, 13 a thermal conductive ceramic member, 14 an electric conductive pin, 15 a multi-layered organic circuit board produced from an organic insulating material, 16 a solder for bonding the contacts on the front face of the intermediate ceramic insulating substrate and those on the front face of the semiconductor chip, 17 a solder for bonding the thermal conductive ceramic member 13 to the back face of the semiconductor chip 12, 18 a soldering material for connecting the pins 14, 19 a solder for connecting the multi-layered organic circuit board 15 and the pins 14 and 20 engageable and disengageable connector pins provided on the back face of the multi-layered organic circuit board 15 for further circuit formation. The back face of the thermal conductive ceramic member 13 is brought into contact with a water-cooled structure (not shown) to be cooled.

The intermediate ceramic insulating substrate 11 serves as an intermediate for mounting the semiconductor chip 12 on the multi-layered organic circuit board 15. Since the intermediate ceramic insulating substrate 11 directly carries the semiconductor chip 12, it is required to have a thermal expansion coefficient of 30 to $65 \times 10^{-7}/°C.$, which is approximate to the thermal expansion coefficient of the semiconductor chip 12. A composite material of silica and borosilicate glass is used for the intermediate ceramic insulating substrate 11. The intermediate ceramic insulating substrate 11 has through hole conductors and inter layer conductors, and the terminals or contacts of the semiconductor chip 12 are bonded to the terminals or contacts on the front face of the intermediate ceramic insulating substrate 11 by the solder 16. On the back face of the intermediate ceramic insulating substrate 11, there are terminals or contacts which are electrically connected directly to the terminals on the front face thereof for the semiconductor chip 12 through through hole conductors. As seen from FIG. 2, the spacing between the adjacent contacts on the back face of the intermediate ceramic substrate 11 is enlarged with respect to that between the adjacent contacts on the front face thereof. To these terminals, pins 14 of copper are bonded by a soldering material such as gold-germanium. Since number of the terminals of the semiconductor chip 12 exceeds 500 pins, the space between the terminals is a 0.45 mm pitch or 0.25 mm pitch.

To the back face of the semiconductor chip 12, the thermal conductive ceramic member 13 such as aluminum nitride is bonded in order to radiate the heat produced from the semiconductor chip 12. Since the thermal conductive ceramic member 13 is directly bonded to the semiconductor chip 12, it is necessary that the thermal expansion coefficient of the thermal conductive ceramic material 13 is approximate to that of the semiconductor chip 12. In order to enhance the heat radiation effect, the larger the thermal conductivity, the better. In order to avoid short circuitting with the adjacent elements, the thermal conductive ceramic member 13 preferably has an insulating property. From these points of view, aluminum nitride ceramic which used calcium oxide or ytrrium oxide as a sintering aid is preferable as a heat radiating material. As to the physical properties, this heat radiating material has a thermal expansion coefficient of 40 to $50 \times 10^{-7}/°C.$, a thermal conductivity of 140 to 260 W/m.K. and an insulation resistance of not less than $10^{13}$ Ω.cm. Silicon carbide ceramic is also suitable. Sintered silicon carbide with a small amount (0.5 to 1 wt %) of beryllium oxide added thereto has a thermal expansion coefficient of 35 to $40 \times 10^{-7}/°C.$, a thermal conductivity of 180 to 270 W/m.K. and an insulation resistance of not less than $10^{10}$ Ω.cm. It is possible to improve the heat radiating property by bringing a water-cooled jacket or radiating fins into contact with the upper portion of thermal conductive ceramic member 13, in that, the radiation plate.

The electrical connection between the terminals on the intermediate ceramic insulating substrate 11 and those on the multi-layered organic circuit board 15 is required to allow relative displacement between the intermediate ceramic insulating substrate 11 and the multi-layered organic circuit board 15 due to the difference in the thermal expansion, the thermal expansion coefficient of the former being 30 to $65 \times 10^{-7}/°C.$ while that of the latter being $150 \times 10^{-7}/°C.$, in order to electrically connect both members with good reliability. For this purpose, the pins 14 are required to be flexible in the parallel direction to the interface between the intermediate ceramic insulating substrate 11 and the multi-layered organic circuit board 15 and to have a certain degree of rigidity in the longitudinal direction. As a pin 14 which satisfies these conditions, a linear copper pin of 0.1 to 0.2 mm in diameter is used.

The pins 14 are fixed on the metallized through holes or via holes of the multi-layered organic circuit board 15 by the lead-tin solder 19. The intermediate ceramic insulating substrate 11 is mechanically coupled to the multi-layered organic circuit board 15 with a predetermined space therebetween through the flexible pins 14, thereby eliminating the influence of the thermal expansion difference between intermediate ceramic insulating substrate 11 and the multi-layered organic circuit board 15.

Figure 3:
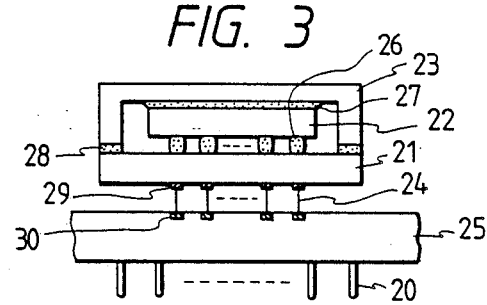
FIG. 3 is a schematic sectional view of another embodiment of a semiconductor chip module according to the present invention and illustrates substantially the corresponding portion to that shown in FIG. 2.

FIG. 3 shows another embodiment of the present invention. The reference numeral 21 represents an intermediate ceramic insulating substrate, 22 a semiconductor chip, 23 a thermal conductive ceramic member, 24 a pin, 25 a multi-layered organic circuit board, 26 to 30 each a solder or a soldering material for bonding. The semiconductor chip 22 is cooled by a water cooling structure (not shown) through the thermal conductive ceramic member 23. In FIG. 3, the thermal conductive ceramic member 23 bonded to the back face of the semiconductor chip 22 has a shape of a cap. The material of the thermal conductive ceramic member 23 is the same as that of the intermediate ceramic insulating substrate 21 and the flange of the thermal conductive ceramic member 23 is bonded to the intermediate ceramic insulating substrate 21 by a solder 28 so that, the thermal conductive ceramic member 23 together with the intermediate ceramic insulating substrate 21 serves to seal the semiconductor chip 22, thereby isolating the semiconductor chip 22 from the ambient air. In this embodiment, the pins 24 also connects the intermediate ceramic insulating substrate 21 to the multi-layered organic circuit board 25 with a space therebetween so as to permit the displacement therebetween due to the difference in the thermal expansion as in the embodiment in FIGS. 1 and 2. Connector pins 20 are further provided on the back face of the multi-layered organic circuit board 25 to connect the multi-layered organic circuit board 25 to another multi-layered organic circuit board (not shown).

Figure 4:
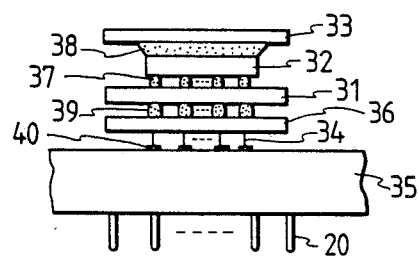
FIG. 4 is a schematic sectional view of still another embodiment of a semiconductor chip module according to the present invention and illustrates substantially the corresponding portion to that shown in FIG. 2.

FIG. 4 shows still another embodiment of the present invention. The reference numeral 31 represents a first intermediate ceramic insulating substrate, 32 a semiconductor chip, 33 a thermal conductive ceramic member, 34 a pin, 35 a multi-layered organic circuit board, 36 a second intermediate ceramic insulating substrate and 37 to 40 each a solder or a soldering material for bonding.

In this embodiment, the intermediate ceramic insulating substrates 11 and 21 included in the first and second embodiments shown in FIGS. 1, 2 and 3 are divided into first and second intermediate ceramic substrates 31 and 36, the first intermediate ceramic insulating substrate 31 has a function to carry the semiconductor chip 32 and the second intermediate ceramic insulating substrate has a function to carry and fix the pins 34. The material of the second intermediate ceramic insulating substrate 36 is selected to have substantially the same thermal expansion coefficient as the first intermediate ceramic insulating substrate 31. The first and second intermediate ceramic insulating substrates 31 and 36 are electrically and mechanically coupled by connecting the corresponding contacts on the respective faces thereof through solder 39. The pins 34 carried and fixed by the second intermediate ceramic insulating substrate 36 are connected to the corresponding contacts or terminals on the front face of the multi-layered organic circuit board through solder 40.

An advantage of the semiconductor chip mounting structure of the present embodiment is that the semiconductor chip 32 is easily disassembled or exchanged through separating the first intermediate ceramic insulating substrate 31 from the second intermediate ceramic insulating substrate 36 by melting the solder 39.

A method of producing the second intermediate ceramic insulating substrate 36 for fixing the pins 34 shown in FIG. 4 will be explained.

As the material of the second intermediate ceramic insulating substrate 36, composite of silica and borosilicate glass, a composite of alumina and borosilicate glass, or a composite material thereof, or the like is used.

In the same way as in the case of producing a general multi-layered ceramic circuit board, through holes of 0.18 mm in diameter are formed in a green sheet of about 0.2 mm thick by punching, and five of the thus-obtained green sheets are laminated. The laminate is baked at a temperature of 850° to 1,000° C., which is the sintering temperature of the composite material, whereby the second intermediate ceramic insulating substrate having through holes of 0.15 mm in diameter and 0.8 mm in thickness is produced. The reason why the diameter of the through holes is changed from 0.18 mm to 0.15 mm and the thickness of the substrate from 0.2 mm×5=1.0 mm to 0.8 mm is that the laminate is shrunk by baking. The diameter, the thickness and the longitudinal and transverse lengths of the green sheet are determined in consideration of the shrinkage ratio due to baking.

Pins having a diameter of 0.1 mm to 0.12 mm are inserted into the second intermediate ceramic insulating substrate provided with a multiplicity of the through holes having a diameter of 0.15 mm. Since the pins have a smaller diameter, the pins are inserted into the respective through holes of the fixing substrate so as to pass through to a predetermined length and they are fixed into the through holes by dropwise adding an epoxy resin from the face of the substrate into the through holes and hardening the epoxy resin. At this time, the length of the pins which are connected to the multi-layered organic circuit board 35 is set at a predetermined length by a jig. The pins extending from the opposite side of the substrate are cut off. In this way, the substrate with the pins fixed thereon are completed.

The embodiment shown in FIG. 4 is preferably fabricated in the following order.

(1) The multi-layered organic circuit board 35 and the second intermediate ceramic insulating substrate 36 provided with pins are fixed by the solder 40 of 97Sn3Pb.

(2) The LSI chip or the semiconductor chip 32 and the radiation plate or the thermal conductive ceramic member 33 are fixed by a soldering material of AuSn.

(3) The semiconductor chip 32 and the chip carrier or the first intermediate ceramic insulating substrate 31 are fixed by a solder of 95Sn5Pb.

(4) The multi-layered organic circuit board 35 with the second intermediate ceramic insulating substate 36 attached thereto and the chip carrier 31 are bonded by the solder 39 of 60Sn40Pb.

Another method of producing the second intermediate insulating substrate provided with pins will be described in the following.

(1) Through holes are formed in a sintered ceramic substrate, e.g., a mullite substrate, aluminum nitride substrate and a silicon carbide substrate by laser or electron beams. A conductive metal wire is passed through the through holes and fixed by a resin.

(2) A ceramic material consisting of silica and borosilicate glass is formed into a green sheet by a doctor blade method. Through holes are formed in the green sheet by punching and a conductor paste consisting of gold, a silver-palladium alloy or copper is embedded in the through holes by printing. The green sheets are laminated and baked. The second intermediate insulating substrate 36 for fixing pins is produced in this way. The electrical connection to both sides of the substrate 36 is achieved by sintering the conductor paste. The pins are bonded to the substrate 36 by a soldering material or a solder such as gold-tin, gold-germanium and tin-lead alloys.

In this embodiment, the substrate 36 is also mechanically coupled to the multi-layered organic circuit board 35 with the pins 34 through a space so that the influence due to difference in the thermal expansion therebetween is eliminated. In this embodiment, connector pins 20 are also provided on the back face of the multi-layered organic circuit board 35 to be further connected to another multi-layered organic circuit board (not shown).

As indicated previously, the intermediate ceramic insulating substrates 11, 21 and 31 may includes a built-in capacitor.

Figure 5:
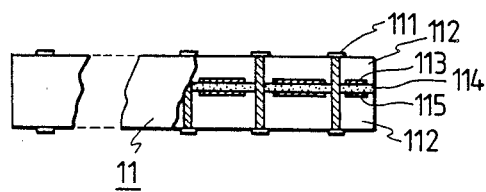
FIG. 5 is a schematic partial sectional view of one embodiment of an intermediate insulating substrate incorporated into the present invention.

The structure thereof will be schematically shown in a partial schematic sectional view in FIG. 5.

The reference numeral 111 represents a through hole conductor provided within the substrate, 112 a ceramic layer composed of a composite material having a low dielectric constant such as a composite of silica and borosilicate glass, 113 an upper electrode constituting a capacitor, 114 a material having a high dielectric constant which essentially consists of PbO and constitutes the main body of the capacitor, and 115 a lower electrode constituting the capacitor.

The substrate shown in FIG. 5 is fabricated, for example, in the following way.

The ceramic layer 112 is produced by forming a green sheet by a doctor blade method from a slurry obtained by mixing silica with borosilicate glass, and embedding a conductor paste of a silver-palladium alloy by printing in the through holes provided in the green sheet. The capacitor portion 114 is also produced by forming a green sheet by a doctor blade method from a material having a high dielectric constant such as PbO and embedding a paste of a silver-palladium alloy in the through holes provided in the green sheet. The upper electrode and the lower electrode are further printed on the sheet. The sheets for the ceramic layer 112 and the capacitor portion 114 are laminated, press-bonded and baked at a temperature of 850° to 950° C. to produce the substrate with a built-in capacitor shown in FIG. 5.

We claim:

1. A semiconductor chip module comprising;
a plurality of semiconductor chips, each provided with an array of contacts on its substantially entire front face;
a multi-layered organic circuit board mounting said semiconductor chips on its front face, said multi-layered organic circuit board is provided on its front face with array of contacts corresponding to the array of contacts of said respective semiconductor chips, and said multi-layered organic circuit board is provided on its back face with a plurality of engage- and disengageable connector pins;
intermediate insulating substrates, each disposed between said respective semiconductor chips and said multi-layered organic circuit board, the thermal expansion coefficient of each of said intermediate insulating substrates is substantially the same as that of said respective semiconductor chips, each of said intermediate insulating substrates is provided with an array of contacts on its front and back faces corresponding to that of the associated semiconductor chip, the contacts on the front face of each of said intermediate insulating substrates are electrically connected directly to the corresponding contacts on the back face thereof, the respective contacts on the front faces of said intermediate insulating substrates are electrically and mechanically connected to the corresponding contacts on the front face of the associated semiconductor chip through a solder;
a connecting member electrically and mechanically connecting the contacts on the back face of each of said intermediate insulating substrates to the corresponding contacts on the front face of said multi-layered organic circuit board, and mechanically coupling said intermediate insulating substrates with said multi-layered organic circuit board to the extent permitting relative displacement of said intermediate insulating substrates to said multi-layered organic circuit board due to thermal expansion difference therebetween through a gap of predetermined distance, said connecting member includes electrical conductors with a predetermined flexibility and rigidity bridged between the respective corresponding contacts on the back face of each of said intermediate insulating substrates and on the front face of said multi-layered organic circuit board and bonded thereat through a solder.

2. The semiconductor chip module according to claim 1 wherein said electrical conductor of said connecting member is formed of a material selected from the group consisting of copper, a copper-alloy, and an iron-nickel alloy.

3. The semiconductor chip module according to claim 2, wherein said electrical conductor of said connecting member is in a pin shape.

4. The semiconductor chip module according to claim 3, wherein the diameter of said pin shaped electrical conductor is 0.1 to 0.2 mm.

5. The semiconductor chip module according to claim 2, wherein said electrical conductor of said connecting member is in a strip shape.

6. The semiconductor chip module according to claim 2, wherein said electrical conductor of said connecting member is in a spiral shape.

7. The semiconductor chip module according to claim 2, wherein said electrical conductor of said connecting member is in a corrugate shape.

8. A semiconductor chip module comprising:
a plurality of semiconductor chips, each provided with an array of contacts on its substantially entire front face;
a multi-layered organic circuit board mounting said semiconductor chips on its front face, said multi-layered organic circuit board is provided on its front face with array of contacts corresponding to the array of contacts of said respective semiconductor chips, and said multi-layered organic circuit board is provided on its back face with a plurality of engage- and disengageable connector pins;
intermediate insulating substrates, each disposed between said respective semiconductor chips and said multi-layered organic circuit board, the thermal expansion coefficient of each of said intermediate insulating substrates is substantially the same as that of said respective semiconductor chips each of said intermediate insulating substrates is provided with an array of contacts on its front and back face corresponding to that of the associated semiconductor chip, the contacts on the front face of each of said intermediate insulating substrates are electrically connected directly to the corresponding contacts on the back face thereof, the respective contacts on the front faced of said intermediate insulating substrates are electrically connected to the corresponding contacts on the front face of the associated semiconductor chip through a solder;
a connecting member electrically connecting the contacts on the back face of each of said intermediate insulating substrates to the corresponding contacts on the front face of said multi-layered organic circuit board, and mechanically coupling said intermediate insulating substrates with said multi-layered organic circuit board to the extent permitting relative displacement of said intermediate insulating substrates to said multi-layered organic circuit board due to thermal expansion difference therebetween through a gap of predetermined distance, the predetermined gap distance between said intermediate insulating substrate and said multi-layered organic circuit board is 0.5 to 1.0 mm, said connecting member includes electrical conductors with a predetermined flexibility and rigidity bridged between the respective corresponding contacts on the back face of each of said intermediate insulating substrate and on the front face of said multi-layered organic circuit board and bonded thereat through a solder.

9. The semiconductor chip module according to claim 1, wherein said intermediate insulating substrate includes first and second intermediate insulating substrates, said first intermediate insulating substrate is provided with an array of contacts each on its front and back faces corresponding to that of said semiconductor chip, the contacts on the front face of said first intermediate insulating substrate are electrically connected directly to the corresponding contacts on the back face of said first intermediate insulating substrate, the respective contacts on the front face of said first intermediate insulating substrate are electrically connected to the corresponding contacts on the front face of said semiconductor chip through a solder, the thermal expansion coefficient of said second intermediate insulating substrate is substantially the same as that of said first intermediate insulating substrate, said second intermediate insulating substrate is provided with an array of contacts each on its front and back faces corresponding to that of said first intermediate insulating substrate, the contacts on the front face of said second intermediate insulating substrate are electrically connected directly to the corresponding contacts on the back face of said second intermediate insulating substrate, the respective contacts on the front face of said second intermediate insulating substrate are electrically connected to the corresponding contacts on the back face of said first intermediate insulating substrate through a solder, and said second intermediate insulating substrate further carries said respective electrical conductors of said connecting member through the respective contacts on the back face of said second intermediate insulating substrate.

10. The semiconductor chip module according to claim 1, wherein said intermediate insulating substrate includes a built-in capacitor.

11. The semiconductor chip module according to claim 10, wherein said built-in capacitor in said intermediate insulating substrate comprises an inorganic layer having a high dielectric constant and formed of a perovskite material selected from the group consisting of PbO, $Fe_2O_3$, $WO_3$, $TiO_2$ and $Nb_2O_5$ and a pair of electrodes disposed on the both faces of the inorganic layer.

12. The semiconductor chip module according to claim 1 wherein the thermal expansion coefficient of said intermediate insulating substrate is 30 to $65 \times 10^{-7}/°C$.

13. A semiconductor chip module comprising:
a plurality of semiconductor chips, each provided with an array of contacts on its substantially entire front face;
a multi-layered organic circuit board mounting said semiconductor chips on its front face, said multi-layered organic circuit board is provided on its front face with array of contacts corresponding to the array of contacts of said respective semiconductor chips, and said multi-layered organic circuit board is provided on its back face with a plurality of engage- and disengageable connector pins;
intermediate insulating substrates, each disposed between said respective semiconductor chips and said multi-layered organic circuit board, the thermal expansion coefficient of each of said intermediate insulating substrates is substantially the same as that of said respective semiconductor chips each of said intermediate insulating substrates is provided with an array of contacts on its front and back faces corresponding to that of the associated semiconductor chip, the contacts on the front face of each of said intermediate insulating substrates are electrically connected directly to the corresponding contacts on the back face thereof, the respective contacts on the front face of said intermediate insulating substrates are electrically connected to the corresponding contacts on the front face of the associated semiconductor chip through a solder, said intermediate insulating substrate is formed of a material selected from the group consisting of composites of silica and borosilicate glass, silica and aluminum borate glass, and alumina and borosilicate glass;
a connecting member electrically connecting the contacts on the back face of each of said intermediate insulating substrates to the corresponding contacts on the front face of said multi-layered organic circuit board, and mechanically coupling said intermediate insulating substrates with said multi-layered organic circuit board to the extend permitting relative displacement of said intermediate insulating substrates to said multi-layered organic circuit board due to thermal expansion difference therebetween through a gap of predetermined distance, said connecting member includes electrical conductors with a predetermined flexibility and rigidity bridged between the respective corresponding contact on the back face of each of said intermediate insulating substrates and on the front face of said multi-layered organic circuit board and bonded thereat through a solder, said electrical conductor of said connecting member is formed of a material selected from the group consisting of a copper, a copper-alloy, and an iron-nickel alloy.

14. The semiconductor chip module according to claim 1, wherein said multi-layered organic circuit board is formed of a material selected from the group consisting of epoxy, isomelamine and fluorine resins.

15. A semiconductor chip module comprising:
a plurality of semiconductor chips, each provided with an array of contacts on its substantially entire front face;
a multi-layered organic circuit board mounting said semiconductor chips on its front face, said multi-layered organic circuit board is provided on its front face with array of contacts corresponding to the array of contacts of said responective semiconductor chips, and said multi-layered organic circuit board is provided on its back face with a plurality of engage- and disengageable connector pins;

intermediate insulating substrates, each disposed between said respective semiconductor chips and said multi-layered organic circuit board, the thermal expansion coefficient of each of said intermediate insulating substrates is substantially the same as that of said respective semiconductor chips each of said intermediate insulating substrates is provided with an array of contacts on its front and back faces corresponding to that of the associated semiconductor chip, the contacts on the front face of each of said intermediate insulating substrates are electrically connected directly to the corresponding contacts on the back face thereof, the respective contacts on the front face of said intermediate insulating substrates are electrically connected to the corresponding contacts on the front face of the associated semiconductor chip through a solder, the spacing between adjacent contacts on the back face of each of said intermediate insulating substrates is larger than that between adjacent contacts on the front face thereof;

a connecting member electrically connecting the contacts on the back face of each of said intermediate insulating substrates to the corresponding contacts on the front face of said multi-layered organic circuit board, and mechanically coupling said intermediate insulating substrates with said multi-layered organic circuit board to the extent permitting relative displacement of said intermediate insulating substrates to said multi-layered organic circuit board due to thermal expansion difference therebetween through a gap of predetermined distance, said connecting member includes electrical conductors with a predetermined flexibility and rigidity bridged between the respective corresponding contacts on the back face of each of said intermediate insulating substrates and on the front face of said multi-layered organic circuit board and bonded thereat through a solder.

16. The semiconductor chip module according to claim 1, wherein each of said semiconductor chip is provided on its back face with a ceramic insulating plate having a high thermal conductivity for radiating heat generated thereby.

* * * * *